United States Patent
Kurchuk

(10) Patent No.: US 10,218,400 B2
(45) Date of Patent: Feb. 26, 2019

(54) TECHNIQUE FOR FILTERING OF CLOCK SIGNALS

(71) Applicant: Alcatel-Lucent USA Inc., Murray Hill, NJ (US)

(72) Inventor: Boris A. Kurchuk, Bridgewater, NJ (US)

(73) Assignee: Nokia of America Corporation, Murray Hill, NJ (US)

( * ) Notice: Subject to any disclaimer, the term of this patent is extended or adjusted under 35 U.S.C. 154(b) by 0 days.

(21) Appl. No.: 15/403,635

(22) Filed: Jan. 11, 2017

(65) Prior Publication Data

US 2017/0149465 A1 May 25, 2017

Related U.S. Application Data

(63) Continuation of application No. 14/675,100, filed on Mar. 31, 2015.

(51) Int. Cl.
| | |
|---|---|
| *H04L 7/00* | (2006.01) |
| *H04B 1/10* | (2006.01) |
| *H04B 1/06* | (2006.01) |
| *H03M 1/12* | (2006.01) |

(52) U.S. Cl.
CPC ............ *H04B 1/1036* (2013.01); *H04B 1/06* (2013.01); *H04B 1/10* (2013.01); *H04L 7/0008* (2013.01); *H03M 1/124* (2013.01)

(58) Field of Classification Search
CPC .... G06F 1/04; H03D 1/00; H03K 9/00; H03L 7/00; H03M 1/124; H04B 1/10;
(Continued)

(56) References Cited

U.S. PATENT DOCUMENTS

| | | |
|---|---|---|
| 5,111,166 A | 5/1992 | Plonka et al. |
| 5,479,449 A | 12/1995 | Patel et al. |

(Continued)

FOREIGN PATENT DOCUMENTS

JP 2006191409 A 7/2006

OTHER PUBLICATIONS

"Introducing LTE-Advanced," www.agilent.com/home, 2011 [retrieved on Mar. 3, 2015] Retrieved from the Internet: <URL: http://cp.literature.agilent.com/litweb/pdf/5990-6706EN.pdf> (36 pages).

(Continued)

*Primary Examiner* — Shawkat M Ali
(74) *Attorney, Agent, or Firm* — Mendelsohn Dunleavy, P.C.; Steve Mendelsohn

(57) ABSTRACT

In one embodiment, a clock generator generates a clock signal, and a clock channel generates a filtered clock signal from the clock signal. The clock channel comprises at least one filter that (i) attenuates noise in at least one Nyquist zone of the clock signal adjacent to the fundamental frequency and (ii) passes at least one harmonic frequency of the clock signal other than the fundamental frequency. A digital-to-analog converter (DAC) digitizes an analog input signal based on the filtered clock signal. Attenuating noise in the Nyquist zones reduces jitter of the filtered clock signal, and passing at least one harmonic frequency of the clock signal other than the fundamental frequency limits the degradation of the slew rate of the clock signal. As a result, the filtered clock signal increases the signal-to-noise ratio of the output of the DAC.

20 Claims, 15 Drawing Sheets

(58) Field of Classification Search
CPC ... H04B 1/26; H04B 7/02; H04B 7/10; H04B 7/185; H04B 7/216; H04J 1/00; H04L 5/14; H04L 7/00; H04L 27/00; H04L 27/06; H04L 27/22
USPC ........ 370/277, 342, 343; 375/144, 260, 267, 375/316, 340, 344, 347, 354, 355; 455/13.3, 307, 324
See application file for complete search history.

(56) References Cited

U.S. PATENT DOCUMENTS

| | | | |
|---|---|---|---|
| 6,097,266 | A | 8/2000 | Nardozza et al. |
| 6,366,622 | B1 | 4/2002 | Brown et al. |
| 7,005,942 | B2 | 2/2006 | Culliton et al. |
| 7,102,470 | B2 | 9/2006 | Chang et al. |
| 7,373,113 | B2 | 5/2008 | Lee et al. |
| 7,376,440 | B2 | 5/2008 | Forrester et al. |
| 7,633,849 | B1 | 12/2009 | Al-Rawi et al. |
| 7,680,227 | B2 | 3/2010 | Kavadias et al. |
| 8,005,233 | B2 | 8/2011 | Smith |
| 8,085,893 | B2 | 12/2011 | Werner |
| 8,472,889 | B2 | 6/2013 | Behzad |
| 8,577,305 | B1 | 11/2013 | Rossi et al. |
| 2002/0140518 | A1 | 10/2002 | Verghese |
| 2005/0064892 | A1 | 3/2005 | Cavin |
| 2006/0055485 | A1 | 3/2006 | Lobeek |
| 2006/0066419 | A1 | 3/2006 | Iwaki et al. |
| 2006/0140222 | A1 | 6/2006 | Wolf et al. |
| 2007/0002961 | A1 | 1/2007 | Hoctor et al. |
| 2008/0001657 | A1 | 1/2008 | Zhang |
| 2008/0055016 | A1 | 3/2008 | Morris, III et al. |
| 2008/0068236 | A1 | 3/2008 | Sheba et al. |
| 2009/0174486 | A1 | 7/2009 | Haralabidis et al. |
| 2010/0058568 | A1 | 3/2010 | Nam et al. |
| 2010/0091688 | A1 | 4/2010 | Staszewski et al. |
| 2010/0194492 | A1 | 8/2010 | Rijssemus |
| 2010/0328157 | A1 | 12/2010 | Culkin et al. |
| 2011/0002424 | A1 | 1/2011 | Le Guillou |
| 2011/0022637 | A1 | 1/2011 | Khader et al. |
| 2011/0075780 | A1* | 3/2011 | Petrovic ............. H03M 1/0614 375/355 |
| 2011/0131439 | A1 | 6/2011 | Renner et al. |
| 2011/0169591 | A1 | 7/2011 | Kim et al. |
| 2011/0227766 | A1 | 9/2011 | McLaughlin et al. |
| 2011/0234439 | A1 | 9/2011 | Nishi |
| 2011/0279296 | A1 | 11/2011 | Henzier et al. |
| 2011/0299630 | A1* | 12/2011 | Petrovic ............. H04B 7/0408 375/340 |
| 2011/0309962 | A1 | 12/2011 | Hernes et al. |
| 2012/0038400 | A1 | 2/2012 | Talaga, Jr. |
| 2012/0062342 | A1 | 3/2012 | Huang et al. |
| 2012/0133400 | A1 | 5/2012 | Yoshimatsu et al. |
| 2012/0321004 | A1 | 12/2012 | Soul et al. |
| 2012/0328058 | A1 | 12/2012 | Etemadi et al. |
| 2013/0229954 | A1 | 9/2013 | Narathong et al. |
| 2013/0230080 | A1 | 9/2013 | Gudem et al. |
| 2013/0272175 | A1 | 10/2013 | Zargari et al. |
| 2013/0272463 | A1 | 10/2013 | Uyehara et al. |
| 2013/0336368 | A1 | 12/2013 | Arima et al. |
| 2014/0210536 | A1 | 7/2014 | Kurchuk |
| 2014/0219140 | A1 | 8/2014 | Uyehara et al. |
| 2014/0235182 | A1 | 8/2014 | Milenkovic et al. |
| 2014/0266824 | A1* | 9/2014 | Lowney ............. H03M 1/1009 341/120 |
| 2015/0065034 | A1 | 3/2015 | Lenive |
| 2015/0180521 | A1 | 6/2015 | Tripurari et al. |

OTHER PUBLICATIONS

Hajimiri, Ali, et al., "Jitter and Phase Noise in Ring Oscillators," IEEE Journal of Solid-State Circuits, vol. 34, No. 6, Jun. 1999, pp. 790-804.

"LO Harmonic Effects on I/Q Balance and Sideband Suppression in Complex I/Q Modulators," www.ti.com, 2010 [retrieved on Mar. 3, 2015] Retrieved from the Internet: <URL: http:/http://www.ti.com/lit/an/slwa059/slwa059.pdf> (16 pages).

Akyildiz, Ian F. et al., "The Evolution to 4G Cellular Systems: LTE-Advanced," Physical Communication 3, 2010, pp. 217-244.

"IMT-Advanced: Requirements and Evaluation Criteria," http://projects.celtic-initiative.org, 2009 [retrieved on Mar. 9, 2015] Retrieved from the Internet: <URL: http://projects.celtic-initiative.org/winner+WINNER+%20Deliverables/D3.1_v1.0.pdf> (64 pages).

Fan Fei, Louis, "Frequency Divider Design Strategies," Broadband Technology, Mar. 2005, (5 pages).

"Clock Dividers Made Easy," www.mikrocontroller.net, 2002 [retrieved on Mar. 31, 2015] Retrieved from the Internet: <URL: http://www.mikrocontroller.net/attachment/177198/Clock_Dividers_Made_Easy.pdf> (19 pages).

Hwang, Myung-Woon, et al., "Design of high speed CMOS prescaler," Proceedings of the Second IEEE Asia Pacific Conference, 2000, pp. 87-90.

Dahlman, Erik, et al., "3G Evolution: HSPA and LTE for Mobile Broadband," Published by Elsevier Ltd., 2007 (485 pages).

Marzetta, Thomas L., "Noncooperative Cellular Wireless with Unlimited Numbers of Base Station Antennas," IEEE Transactions on Wireless Communications, vol. 9, No. 11, Nov. 2010, pp. 3590-3600.

Larsson, Erik G., et al., "Massive MIMO for Next Generation Wireless Systems," IEEE Communications Magazine, 2014, vol. 52, No. 2., pp. 186-195.

Shepard, Clayton et al., "Argos: Practical Many-Antenna Base Stations," Proc. ACM Int. Conf. Mobile Computing and Networking (MobiCom), Istanbul, Turkey, 2012, pp. 53-64.

"MAX2828/MAX2829 Single-/Dual-Band 802.11a/b/g World-Band Transceiver ICs," www.maximintegrated.com, 2004 [retrieved on Apr. 7, 2016] Retrieved from the Internet: <URL: https://www.maximintegrated.com/en/products/comms/wireless-rf/MAX2828.html> (39 pages).

Shepard, Clayton et al., "ArgosV2: A Flexible Many-Antenna Research Platform," Proc. 19th Ann. Int. Conf. Mobile Computing and Networking (MobiCom), 2013, pp. 163-165.

"Single Ended or Differential Clock and Analog Inputs?", Application Note, e2v semiconductors SAS 2007, pp. 1-11.

Roy, Sébastien, "Two-Layer Linear Processing for Massive MIMO on the Titan MIMO Platform," Nutaq white paper on MIMO Platform (2015).

"5G Massive MIMO Testbed: From Theory to Reality," www.ni.com, 2004 [retrieved on Apr. 7, 2016] Retrieved from the Internet: <URL: http://www.ni.com/white-paper/52382/en/> (11 pages).

"Building an Affordable 8×8 MIMO Testbed with NI USRP," www.ni.com, 2014 [retrieved on Apr. 7, 2016] Retrieved from the Internet: <URL: http://www.ni.com/white-paper/14311/en/> (5 pages).

"JESD204B Subclasses (part 1): Intro and Deterministic Latency," www.edn.com, 2014 [retrieved on Apr. 7, 2016] Retrieved from the Internet: <URL: http://www.edn.com/design/analog/4431365/JESD204B-Subclasses-part-1--Intro-and-Deterministic-Latency> (11 pages).

"JESD204B Subclasses (Part 2): Subclass 1 vs. Subclass 2 System Considerations," www.analog.com, 2014 [retrieved on Apr. 7, 2016] Retrieved from the Internet: <URL: http://www.analog.com/media/en/technical-documentation/technical-articles/JESD204B-Subclasses-Part-2-Subclass-1-vs-Subclass-2-System-Considerations-MS-2677.pdf> (6 pages).

Kurchuk, Boris A., et al., "Multichannel Receiver," U.S. Appl. No. 14/675,100, filed Mar. 31, 2015 (26 pages).

Hasan, S.M. Shajedul, et al., "Integration of Simple Antennas to Multiband Receivers using a Novel Multiplexer Design Methodology," IEEE Trans. Ant. & Prop., vol. 60, No. 3, 2012, pp. 1550-1556.

Doan, Chinh H., et al., "Design Considerations for 60 GHz CMOS Radios," IEEE Communications Magazine, 2004, vol. 42, No. 12, pp. 132-140.

(56) References Cited

OTHER PUBLICATIONS

Zhou, Shengli et al., "Optimal Transmitter Eigen-Beamforming and Space-Time Block Coding Based on Channel Mean Feedback," IEEE Transactions on Signal Processing, vol. 50, No. 10, 2002, pp. 2599-2613.

Madhow, U., et al., "Distributed massive MIMO: algorithms, architectures and concept systems," Information Theory and Applications Workshop (ITA), 2014 (7 pages).

Rogalin, R., et al., "Scalable Synchronization and Reciprocity Calibration for Distributed Multiuser MIMO IEEE," Transactions on Wireless Communications, vol. 13, No. 4, 2014, pp. 1815-1816.

Ayach, Omar El, et al., "Spatially Sparse Precoding in Millimeter Wave MIMO Systems," IEEE Transactions on Wireless Communications, vol. 13, No. 3, 2014, pp. 1499-1513.

Obara, Tatsunori et al., "Joint Fixed Beamforming and Eigenmode Precoding for Super High Bit Rate Massive MIMO Systems Using Higher Frequency Bands," IEEE 25th Annual International Symposium on Personal, Indoor, and Mobile Radio Communication (PIMRC) 2014, pp. 607-611.

Hong, M., et al., "Joint Base Station Clustering and Beamformer Design for Partial Coordinated Transmission in Heterogeneous Networks," IEEE Journal on Selected Areas in Communications, vol. 31, No. 2, Feb. 2013.

Adhikary, A., et al., "Joint Spatial Division and Multiplexing—The Large Scale Array Regime," IEEE Transactions on Information Theory, vol. 59, No. 10, Oct. 2013.

Nam, J., et al., "Joint Spatial Division and Multiplexing: Opportunistic Beamforming, User Grouping and Simplified Downlink Scheduling," IEEE Journal of Selected Topics in Signal Processing, vol. 8, No. 5, Oct. 2014.

Brannon, B., "Sampled Systems and the Effects of Clock Phase Noise and Jitter," Application Note AN-756 (2004), Analog Devices, Retrieved from: www.analog.com on Mar. 6, 2013, pp. 1-12.

Redmayne, D., et al., "Understanding the Effect of Clock Jitter on High Speed ADCs", Linear Technology Design Note 1013, Linear Technology Corporation 2006, pp. 1-4.

Kester, W., "Converting Oscillator Phase Noise to Time Jitter", pp. 1-10, MT-008, 2009, Analog Devices, Inc, pp. 1-10.

Buchanan, D., "Performance of an IF sampling ADC in receiver applications", International-IC Conference Proceedings, China, 2001, pp. 63-77.

Hajimiri, A., et al., "Jitter and phase noise in ring oscillators," IEEE Journal of Solid-State Circuits, vol. 34, No. 6, Jun. 1999.

Neu, T., "Impact of sampling-clock spurs on ADC performance", TI Analog Applications Journal, Texas Instruments Incorporated, 3Q 2009.

Neu, T., "Clock jitter analyzed in the time domain", Part 1, Analog Applications Journal, 3Q 2010, Texas Instruments Incorporated.

Neu, T., "Clock jitter analyzed in the time domain", Part 2, Analog Applications Journal, 4Q 2010, Texas Instruments Incorporated.

Neu, T., "Clock jitter analyzed in the time domain", Part 3, Analog Applications Journal, 3Q 2011, Texas Instruments Incorporated.

Samori, C., et al., "Experimental verification of the link between timing jitter and phase noise," Electronics Letters, vol. 34, No. 21, pp. 2024,2025, Oct. 15, 1998.

Razavi, B., "RF Microelectronics," Prentice Hall, 1998, pp. 290-297.

\* cited by examiner

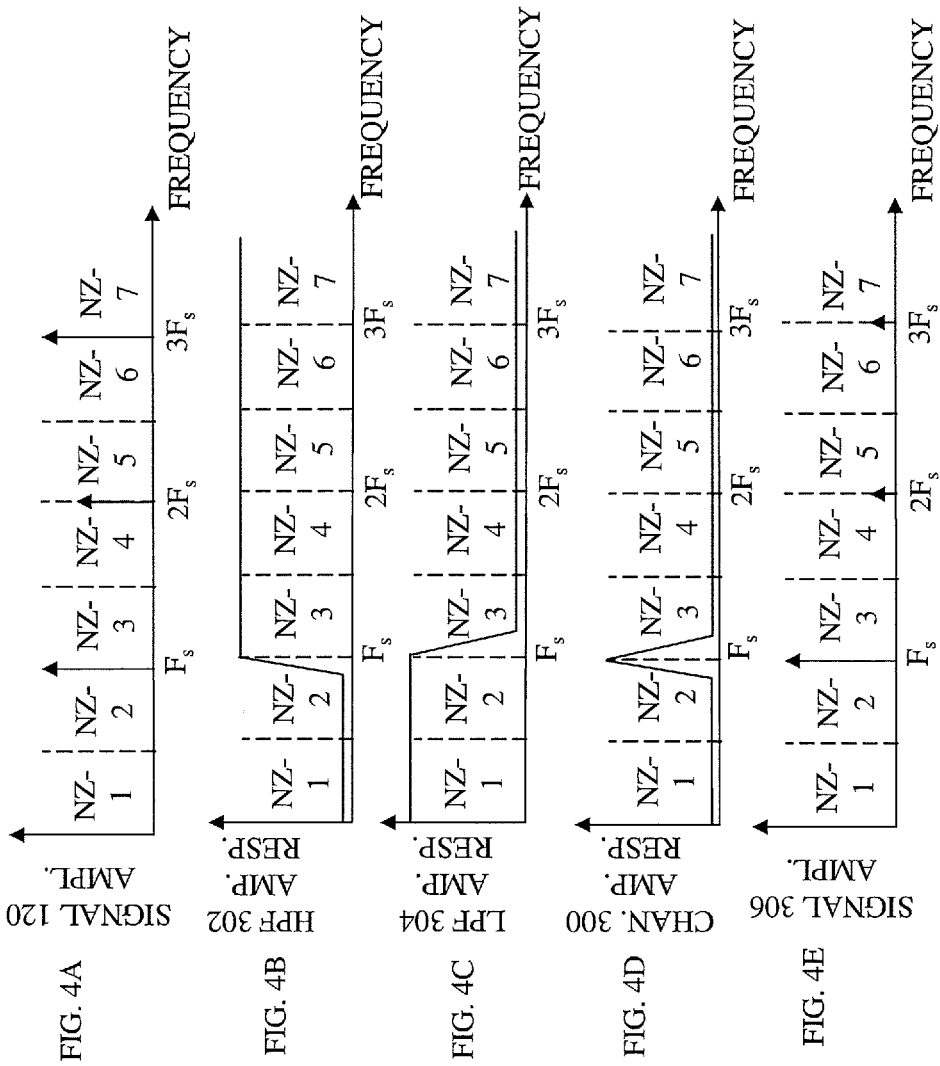

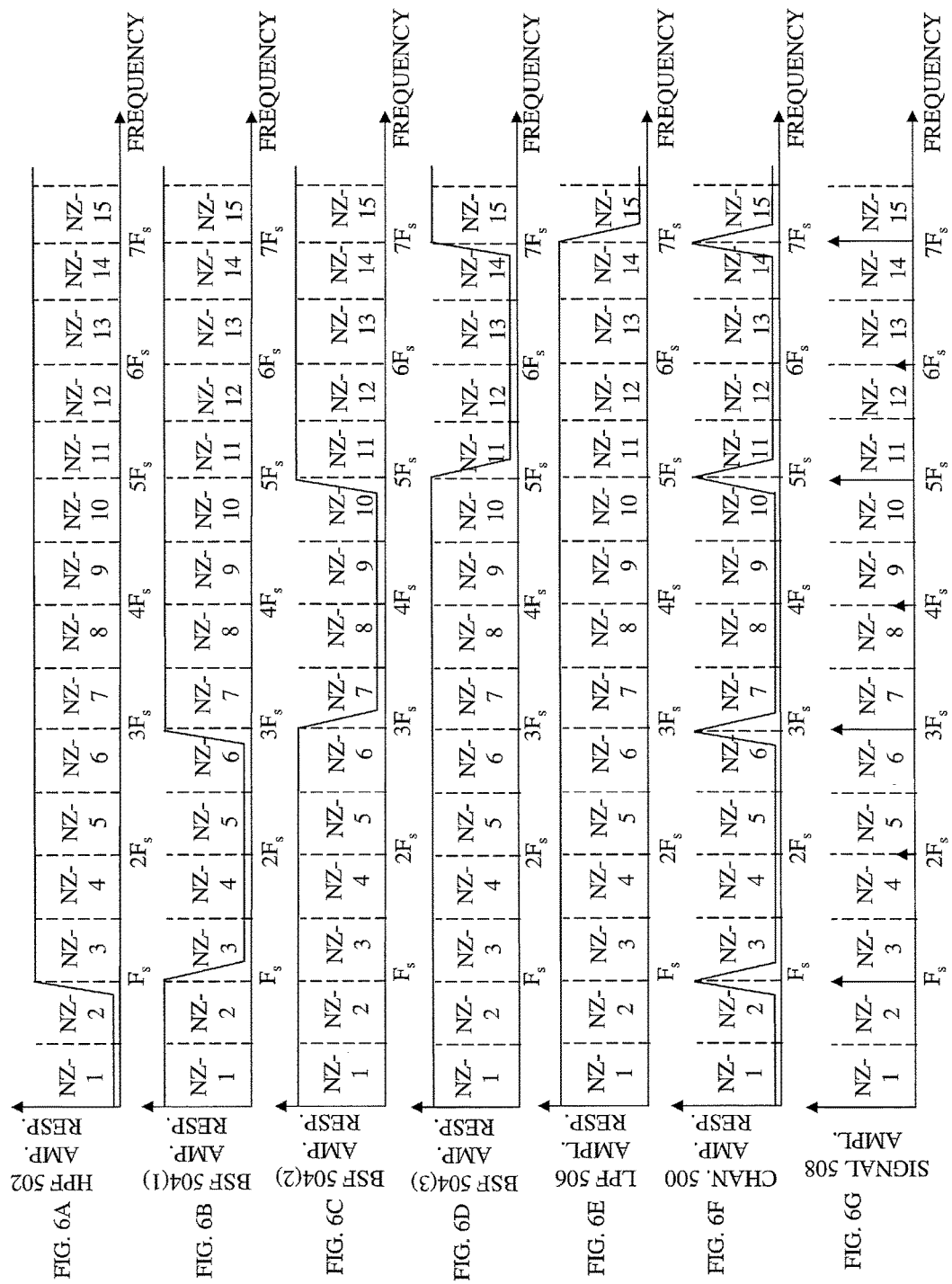

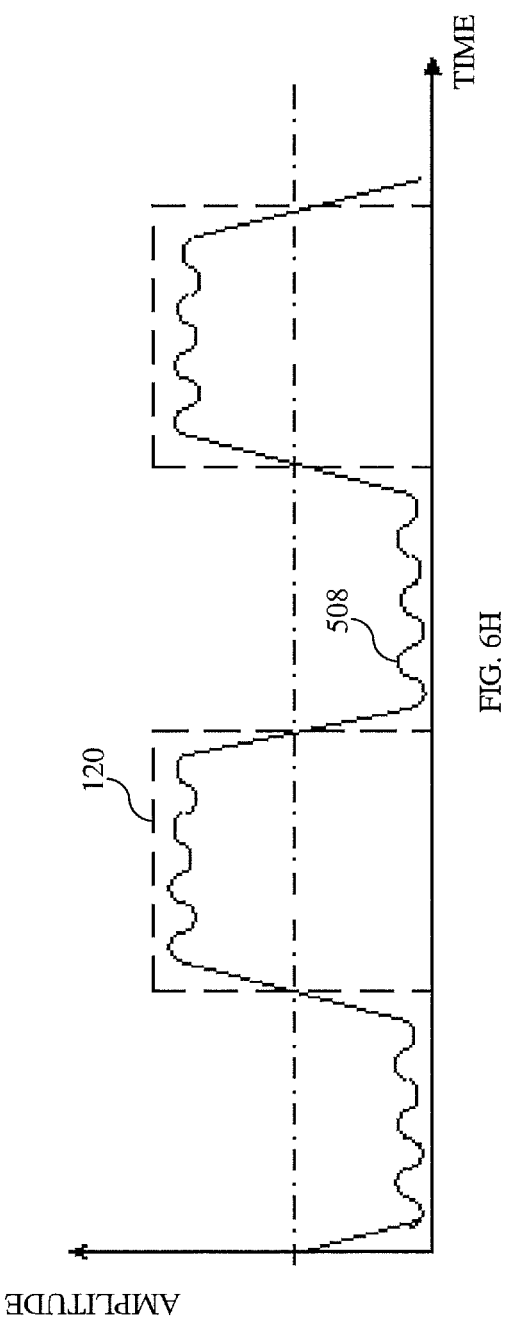

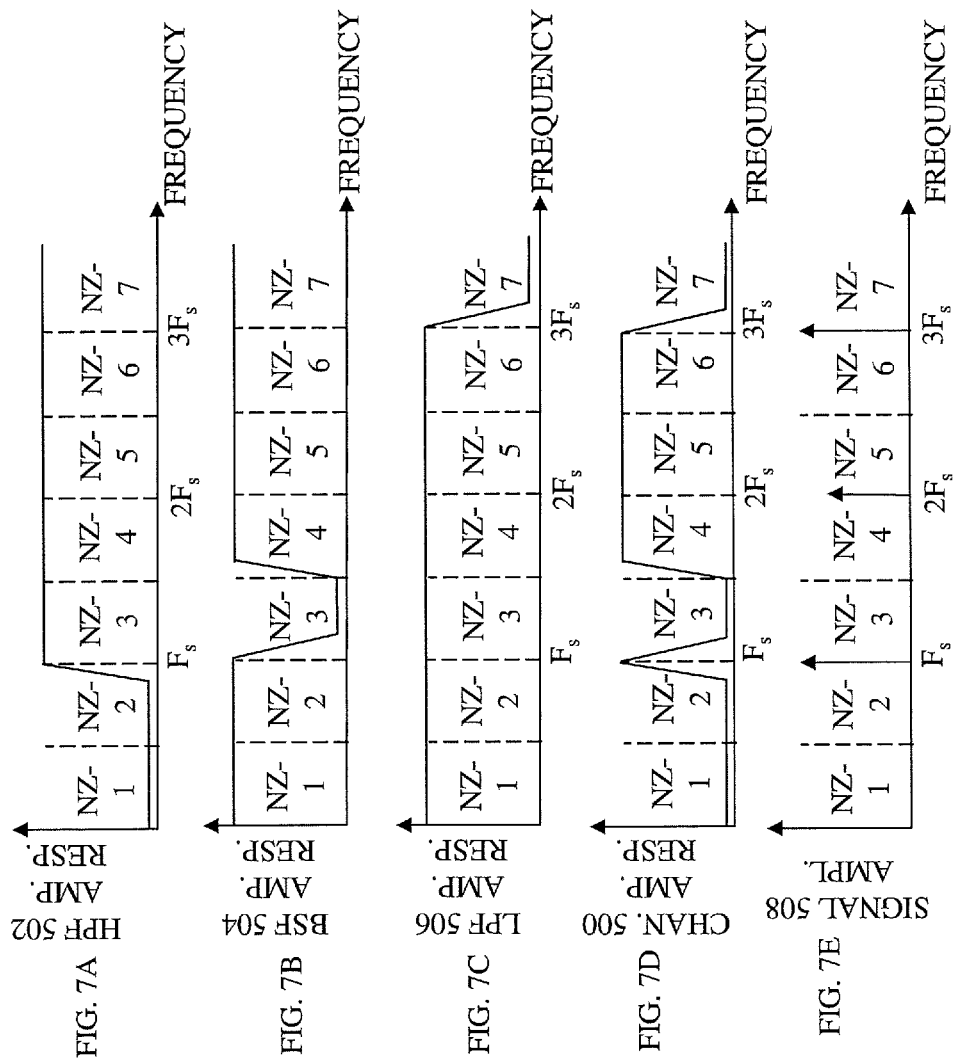

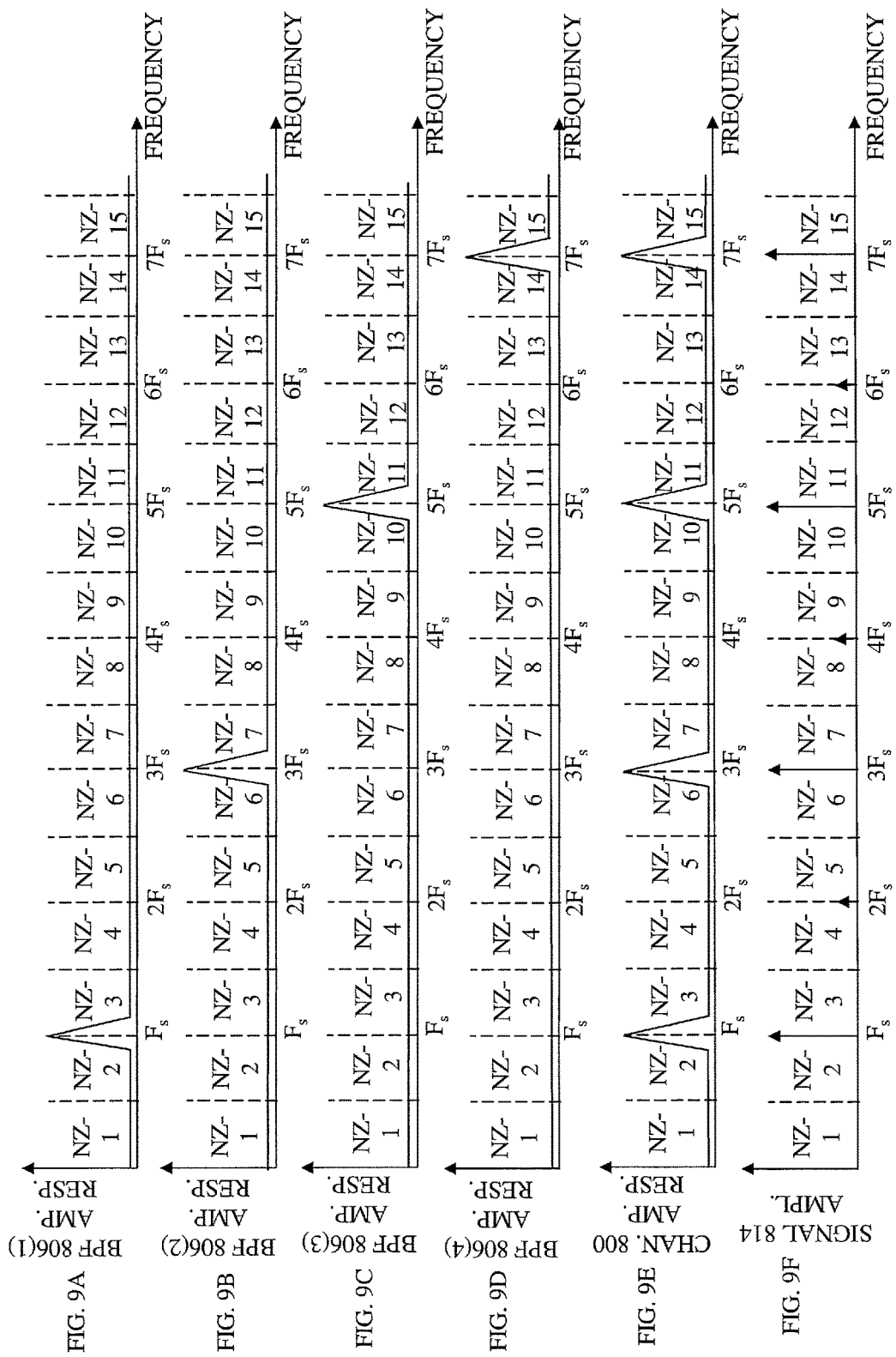

TECHNIQUE FOR FILTERING OF CLOCK SIGNALS

CROSS-REFERENCE TO RELATED APPLICATIONS

This application is a continuation of U.S. patent application Ser. No. 14/675,100, filed on Mar. 31, 2015, ("the '100 application"), the teachings of which are incorporated herein by reference in its entirety. The subject matter of this application is related to the subject matter of U.S. patent application Ser. No. 13/755,752, filed on Jan. 31, 2013, the teachings of which were incorporated by reference into the '100 application.

BACKGROUND

Field of the Invention

The present invention relates to reference clock signals, and, more specifically but not exclusively, to the generation of sampling clock signals for data converters.

Description of the Related Art

In a conventional wireless communication system comprising a digital radio receiver, the performance of the digital radio receiver is critical to the overall performance of the system. Further, the performance of the digital radio receiver depends, in part, on the operation of the receiver components such as the analog-to-digital converter (ADC). In general, the output of an ADC can be considered to be (i) the multiplication of all signals at the analog input of the ADC and all signals at the sampling clock input of the ADC in the time domain or (ii) the convolution of these signals in the frequency domain. Thus, the digital output of the ADC may be a combination of different products of (i) the analog input signal, which includes noise from the signal path and (ii) the sampling clock signal, which includes noise from the clock path. Noise in the clock path can typically degrade performance of the ADC, and consequently, the performance of the digital radio receiver.

SUMMARY

In one embodiment, an apparatus comprises (i) a clock generator configured to generate an initial clock signal having a fundamental frequency and (ii) a clock channel configured to generate a filtered clock signal based on the initial clock signal. The clock channel comprises at least one filter configured to (i) attenuate noise in at least one Nyquist zone of the initial clock signal adjacent to the fundamental frequency and (ii) pass at least one harmonic frequency of the initial clock signal other than the fundamental frequency to generate the filtered clock signal.

In another embodiment, a method for processing an input signal comprises generating an initial clock signal having a fundamental frequency, and generating a filtered clock signal based on the initial clock signal by (i) attenuating noise in at least one Nyquist zone of the initial clock signal adjacent to the fundamental frequency and (ii) passing at least one harmonic frequency of the initial clock signal other than the fundamental frequency to generate the filtered clock signal.

BRIEF DESCRIPTION OF THE DRAWINGS

Other aspects, features, and advantages of the present invention will become more fully apparent from the following detailed exemplary description, the appended claims, and the accompanying drawings in which like reference numerals identify similar or identical elements.

FIG. 4A graphically illustrates a frequency-domain representation of the spectrum of the sampling clock signal received by the receiver clock channel in FIG. 3;

FIGS. 4B-4D graphically illustrate frequency-domain representations of the amplitude responses of the high-pass filter, the low-pass filter, and the receiver clock channel in FIG. 3, respectively;

FIG. 4E graphically illustrates a frequency-domain representation of the sampling clock signal output by the receiver clock channel in FIG. 3;

FIGS. 6A-6F graphically illustrate frequency-domain representations of the amplitude responses of the high-pass filter, the band-stop filters, the low-pass filter, and the receiver clock channel in FIG. 5, respectively;

FIG. 6G graphically illustrates a frequency-domain representation of the sampling clock signal output by the receiver clock channel in FIG. 5;

FIG. 6H graphically illustrates time-domain representations of the waveforms of (i) a sampling clock signal input to and (ii) a sampling clock signal output by the receiver clock channel in FIG. 5;

FIGS. 7A-7E graphically illustrate frequency-domain representations of the amplitude responses of a high-pass filter, a band-pass filter, a low-pass filter, and a receiver clock channel, respectively, according to another embodiment of the disclosure;

FIGS. 9A-9E graphically illustrate frequency domain representations of the amplitude responses of the band-pass filters and receiver clock channel in FIG. 8;

FIG. 9F graphically illustrates a frequency-domain representation of the sampling clock signal output by the receiver clock channel in FIG. 8;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
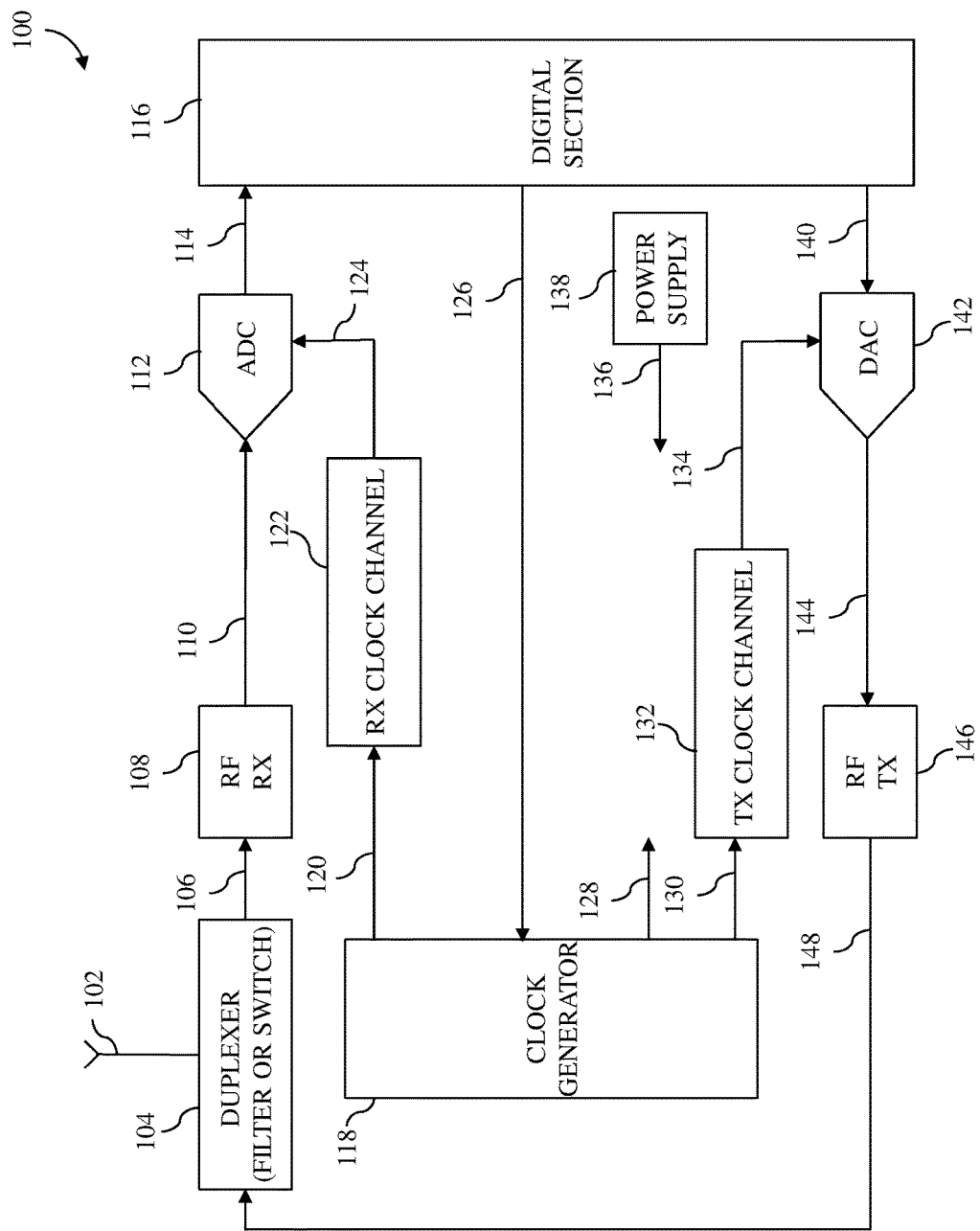
FIG. 1 shows a simplified block diagram of one implementation of a digital radio.

FIG. 1 shows a simplified block diagram of one implementation of a digital radio 100. Digital radio 100 comprises (i) a wireless radio receiver that is implemented by antenna 102, duplexer (filter or switch) 104, radio-frequency (RF) receiver (RX) 108, analog-to-digital converter (ADC) 112, and digital section 116, and (ii) a wireless radio transmitter that is implemented by digital section 116, digital-to-analog converter (DAC) 142, RF transmitter (TX) 146, duplexer (filter or switch) 104, and antenna 102. Digital radio 100 also comprises power supply 138, which provides voltages for various circuits of digital radio 100 and which may comprise both switching and linear regulators. In addition, digital radio 100 includes clock generator 118, receiver clock channel 122, and transmitter clock channel 132.

Sampling of the inputs of ADC 112 and DAC 142 is controlled by sampling clock signals 124 and 134, respectively, which are generated based on a reference clock signal 126 provided by digital section 116 to clock generator 118. In general, clock generator 118 generates synchronized, clean clock signals 120 and 130 from reference clock signal 126, which can be extracted from a timing signal (not shown) received by digital radio 100, by performing processing such as, but not limited to, jitter and phase noise reduction, clock distribution, and generation of the clock signals at the desired clock frequency. Clock signal 120 is provided to ADC 112 via receiver clock channel 122, and sampling clock signal 130 is provided to DAC 142 via transmitter clock channel 132. Clock generator 118 may also generate one or more synchronized, clean clock signals 128 for use by other analog and digital circuits (not shown) of digital radio 100.

The performance characteristics of the wireless communications system in which digital radio 100 resides, such as transmission range, transmission data rate, data throughput, and system spectral efficiency, depend in part on the performance of the receiver of digital radio 100, including the performance of ADC 112. For example, increasing the signal-to-noise ratio (SNR) and spurious free dynamic range (SFDR) at the output of ADC 112 tends to reduce the noise figure and increase the sensitivity and the dynamic range of the wireless communications system, and consequently, tends to increase the transmission range, transmission data rate, data throughput, and/or system spectral efficiency of the system. In contrast, reducing the SNR and SFDR at the output of ADC 112 tends to increase the noise figure and decrease the sensitivity and dynamic range of the wireless communications system, and consequently, tends to decrease the transmission range, transmission data rate, data throughput, and/or system spectral efficiency of the system.

The SNR of the output of ADC 112 may be affected by various circuits and signals in digital radio 100. In general, the output of ADC 112 can be considered to be (i) the multiplication of all signals at the analog input of ADC 112 and all signals at the sampling clock input of ADC 112 in the time domain or (ii) the convolution of these signals in the frequency domain. Thus, digital signal 114 of ADC 112 may be a combination of different products of (i) analog input signal 110, which includes noise from the signal path and (ii) sampling clock signal 124, which includes noise from the clock path. Noise in the clock path comprises noise from all circuits in the clock path, including clock generator 118, receiver clock channel 122, and ADC 112, and may also comprise noise from electrically or magnetically coupled signals 106, 110, 114, 126, 128, 130, 134, 136, 140, 144, 148, and digital signals in digital section 116 due to different crosstalk and coupling mechanisms.

Jitter and slew rate of the sampling clock signal are other parameters that affect the SNR of the output of ADC 112. Increasing the slew rate (decreasing the rise time) of sampling clock signal 124 lessens the amount of time that noise can be present during clock transitions and effectively lessens the amount of noise introduced at the digital output 114 of ADC 112. Increasing the slew rate of the clock edge reduces the effects of noise and jitter by leaving ADC 112 less exposed, and as a result, improves the SNR of the output of ADC 112. Decreasing the slew rate (increasing the rise time) of sampling clock signal 124, on the other hand, increases the amount of time that noise can be present during clock transitions and effectively increases the amount of noise introduced at the digital output 114 of ADC 112, thereby degrading the SNR of the output of ADC 112.

The slew rate of sampling clock signal 124 typically depends on the performance of clock generator 118 and the transmission bandwidth of receiver clock channel 122. Increasing the transmission bandwidth of receiver clock channel 122 tends to increase the slew rate of sampling clock signal 124. For example, the transmission bandwidth should typically be greater than or equal to three times the sampling clock frequency in order prevent the slew rate of the sampling clock signal from degrading significantly. However, as described below, increasing the transmission bandwidth to increase the slew rate may also have the adverse effect of increasing jitter integration bandwidth, which tends to increase sampling clock jitter.

Sampling clock jitter typically depends on the performance of all circuits in the clock chain. Total jitter can be calculated as the root-sum-square of the jitter introduced by the circuits in the clock chain if sources of jitter are not correlated. Jitter of a particular sampling clock signal can be estimated by integrating the phase-noise power of the clock signal in the frequency domain. See, for example, Ali Hajimiri, "Jitter and Phase Noise in Ring Oscillators," IEEE Journal of Solid-State Circuits, Vol. 34, No. 6, June 1999, and Walt Kester, "Converting Oscillator Phase Noise to Time Jitter," Analog Devices Tutorial MT-008, the teachings of all of which are incorporated herein by reference in their entirety. Phase noise is the ratio of the noise amplitude in a 1-Hz bandwidth at a specified frequency offset, $f_m$, to the signal amplitude of the oscillator of clock generator 118 at frequency $f_0$. High phase noise and large integration bandwidth tend to increase the sampling clock jitter. To further understand the effects of phase noise and integration bandwidth on sampling clock jitter, consider FIG. 2.

Figure 2:
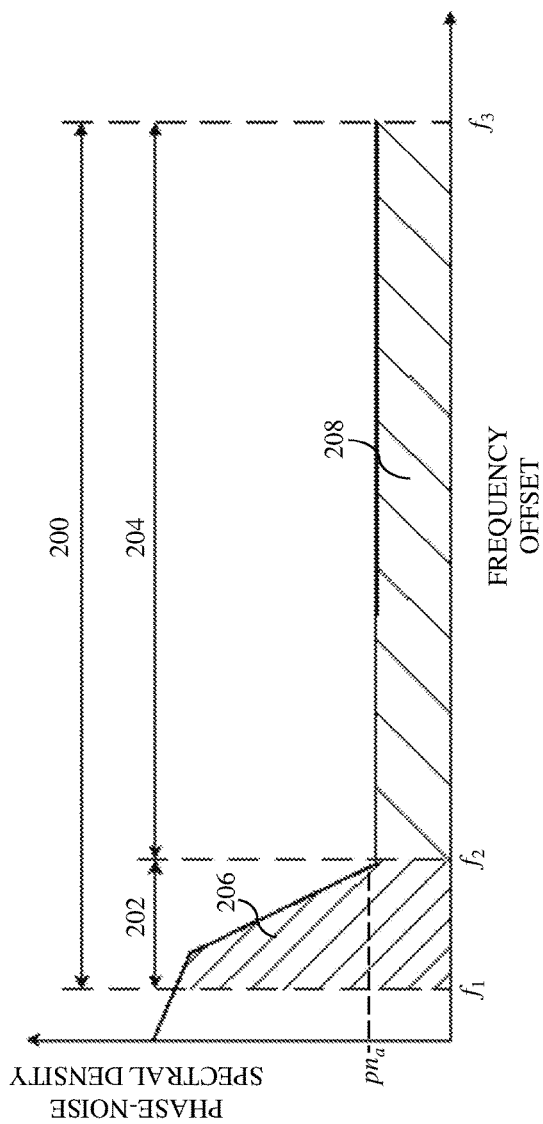
FIG. 2 graphically illustrates a frequency-domain representation of the phase-noise of the sampling clock signal received by the receiver clock channel in FIG. 1.

FIG. 2 graphically illustrates a frequency-domain representation of the phase-noise spectral density of clock signal 120. As shown, the vertical axis is the phase-noise spectral density, and the horizontal axis is the frequency offset $f_m$ relative to the frequency of the oscillator of clock generator 118. The phase-noise integration bandwidth 200 for the purpose of jitter estimation is split into (i) close-in phase-noise bandwidth 202, measured between frequency offsets $f_1$ and $f_2$, and producing close-in jitter 206 (i.e., proportional to the shaded area between frequency offsets $f_1$ and $f_2$), and (ii) wideband phase-noise bandwidth 204, measured between frequency offsets $f_2$ and $f_3$, and producing wideband jitter 208 (i.e., proportional to the shaded area between frequency offsets $f_2$ and $f_3$). Total jitter is a sum of close-in jitter 206 and wideband jitter 208. Frequency offsets $f_1$, $f_2$, and $f_3$ are boundaries for the integration bandwidth 200, whose values depend on the overall application and the design of digital radio 100.

Close-in jitter 206 introduced by clock generator 118 typically depends on the performance of the phase-locked loop (PLL) circuit (not shown) in clock generator 118 (assuming clock generator 118 implements a PLL). Advances in microelectronics fabrication technology and circuit design have resulted in the development of PLL circuits with reduced close-in phase noise and the associated jitter 206.

Wideband jitter 208 typically depends on the phase-noise spectral density $pn_a$ and wideband phase noise bandwidth 204, measured as a difference between frequency offsets $f_2$ and $f_3$. Frequency offset $f_2$ depends mostly on the design of clock generator 118, while frequency offset $f_3$ is correlated to the transmission bandwidth of the receiver clock channel 122, the frequency of the sampling clock signal 120 provided to ADC 112, and the bandwidth of the encode circuit of the ADC 112. As described above, if the frequency of the sampling clock signal increases, then the slew rate of the sampling clock signal typically tends to decrease, thereby reducing the impact of noise on the sampling clock jitter. However, at the same time, increasing the frequency of the sampling clock signal may increase the wideband noise bandwidth 204 of the sampling clock signal, thereby increasing impact of the wideband jitter 208 (i.e., proportional to the shaded area between frequency offsets $f_2$ and $f_3$).

The impact of sampling clock jitter on the performance of ADC 112 is further magnified as the frequency of analog input signal 110 is increased. Modern digital radio receiver system architectures, such as Software radio, direct RF, and sub-sampling architectures employ increasingly higher analog input signal frequencies (e.g., up to GHz frequency range), thereby increasing the impact of sampling clock jitter on the SNR of the output of the ADC.

Modern wireless infrastructure communication standards such as LTE, LTE-Advanced, and IEEE 802.11ac employ increasingly wider transmission channel bandwidths and aggregated transmission channel bandwidths. For example, LTE wireless systems may have a transmission channel bandwidth up to 20 MHz, Advanced LTE systems may have an aggregated channel bandwidth up to 100 MHz, and IEEE 802.11ac standard systems may have a clock channel bandwidth up to 160 MHz. The general sampling theorem for sampling a band-limited analog signal states that the sampling rate should be at least two times the highest frequency component of the analog signal, or the bandwidth of the analog signal. This sampling rate, known as the Nyquist rate, ensures that the original signal can be reconstructed from the sample. The actual sampling clock frequency in a wireless system may depend on the transceiver architecture and the system tradeoffs; however, a main trend can be identified: as the channel bandwidth in the wireless systems is widened, the Nyquist sampling clock frequency should be correspondingly increased to meet the general sampling theorem conditions. If the sampling clock frequency is increased in a broadband system, the clock channel's wideband phase noise tends to increase the bandwidth, and consequently the wideband jitter, of the sampling clock signal.

Figure 3:
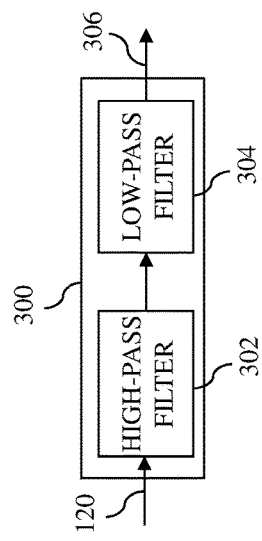
FIG. 3 shows a simplified block diagram of one implementation of a receiver clock channel.

FIG. 3 shows a simplified exemplary block diagram of a serial implementation of a receiver clock channel 300 according to one embodiment of the disclosure. Receiver clock channel 300, which may be used to implement receiver clock channel 122 of FIG. 1, attempts to overcome the above-mentioned problem of wideband jitter by reducing the phase-noise spectral density of clock signal 120 to generate a cleaner sampling clock signal 306 that is provided to, for example, ADC 112. Receiver clock channel 300 comprises a high-pass filter (HPF) 302 and a low-pass filter (LPF) 304. Receiver clock channel 300 also comprises transmission lines (not shown), connecting the components of receiver clock channel 300 to one another and to clock generator 118 and ADC 112, that tend to degrade the clock signal due to electro-magnetic interference, impedance mismatch, ringing, etc. HPF 302 and LPF 304 together form a band-pass filter (BPF) centered at the fundamental frequency of clock signal 120. To further understand the operation of receiver clock channel 300, consider FIGS. 4A-4G.

FIG. 4A graphically illustrates a frequency-domain representation of clock signal 120. FIGS. 4B-4D graphically illustrate frequency-domain representations of the amplitude responses of HPF 302, LPF 304, and receiver clock channel 300, respectively. FIG. 4E graphically illustrates a frequency-domain representation of sampling clock signal 306. Each horizontal axis in FIGS. 4A-4E is broken down into seven Nyquist zones NZ-1 through NZ-7, where the Nyquist zones are defined as intervals of $F_s/2$ in the frequency domain of the sampled signal, and $F_s$ indicates the fundamental frequency of the sampling clock signal.

Fourier analysis can be used to decompose the sampling clock signal, which is periodic, into a Fourier series, a sum of scaled sine and cosine terms that comprise a discrete set of frequency components. As shown in FIG. 4A, clock signal 120, which is a square wave, has amplitudes at the fundamental frequency $F_s$, and the odd-numbered harmonic frequencies (e.g., $3F_s$, $5F_s$, etc.) that are relatively high compared to the amplitudes at the even-numbered harmonic frequencies (e.g., $2F_s$, $4F_s$, etc.). In an ideal square wave, the amplitudes of the odd-numbered harmonics vary inversely with the harmonic number and the amplitudes at the even-numbered harmonic frequencies would not exist at all. However, in real clock signals the amplitudes at the even-numbered harmonic frequencies present and create waveform distortions.

Figure 4F:
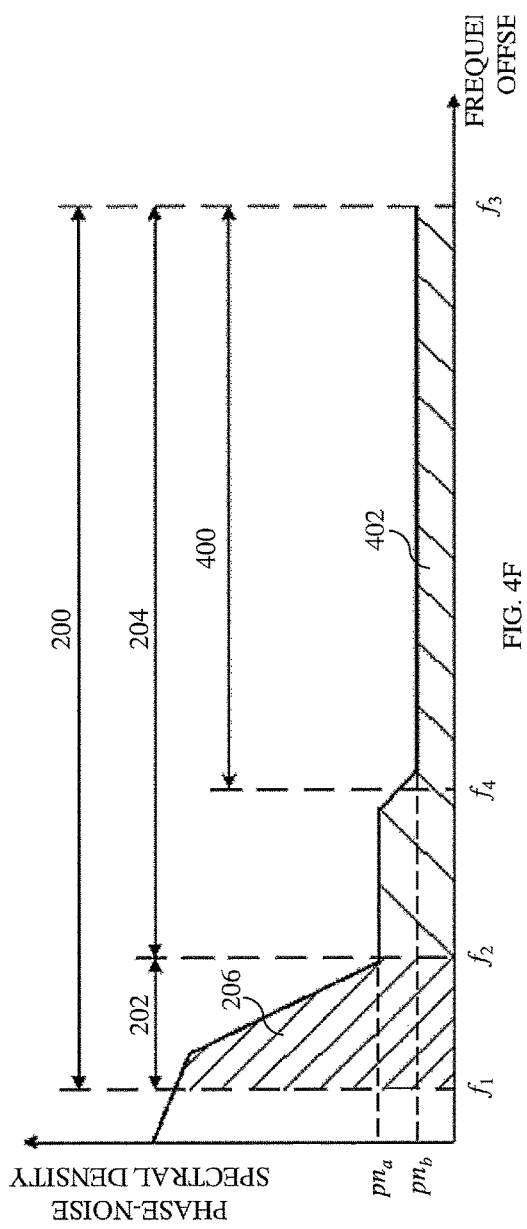
FIG. 4F graphically illustrates a frequency-domain representation of the phase-noise of sampling clock signal output by the receiver clock channel in FIG. 3.

As shown in FIG. 4B, HPF 302 (i) passes the fundamental frequency $F_s$ of the sampling clock signal and the noise in all frequencies above the fundamental frequency $F_s$ with little to no attenuation and (ii) attenuates the noise in Nyquist zones NZ-1 and NZ-2. Further, as shown in FIG. 4C, LPF 304 (i) passes the fundamental frequency $F_s$ and the noise in Nyquist zones NZ-1 and NZ-2 with little to no attenuation and (ii) attenuates the noise in the frequencies above the fundamental frequency $F_s$. Thus, together, HPF 302 and LPF 304 (i) pass the fundamental frequency $F_s$ of clock signal 120 with little attenuation and (ii) attenuate most other noise, including noise from electrically or magnetically coupled signals 106, 110, 114, 126, 128, 130, 134, 136, 140, 144, 148, and digital signals in digital section 116 as shown in FIG. 4D. The resulting sampling clock signal 306, shown in FIG. 4E, has an amplitude at fundamental frequency $F_s$ that is not attenuated and amplitudes at harmonic frequencies above the fundamental frequency $F_s$ that are attenuated. The effects of receiver clock channel 300 on the quality of sampling clock signal 306 are illustrated in FIGS. 4F and 4G, described as follows.

FIG. 4F graphically illustrates a frequency-domain representation of the phase-noise spectral density of sampling clock signal 306. The phase-noise spectral density of sampling clock signal 306 is similar to that of clock signal 120 shown in FIG. 2; however, since receiver clock channel 300 passes only signals near the fundamental frequency $F_s$ of clock signal 120, much of the phase noise within wideband bandwidth 204 (i.e., within bandwidth 400) is reduced from level $pn_a$ to level $pn_b$. Note that frequency offset $f_4$ corresponds to ½ of the pass-band frequency of the BPF implemented by HPF 302 and LPF 304. As a result, wideband jitter 402 of sampling clock signal 306 (i.e., proportional to the shaded area between frequencies $f_2$ and $f_3$) is less than wideband jitter 208 of clock signal 120 shown in FIG. 2. This reduction of wideband jitter should contribute to an increase of the SNR of the output of ADC 112. However, as shown in FIG. 4G, passing only the fundamental frequency $F_s$ may actually decrease the SNR of the output of ADC 112.

Figure 4G:
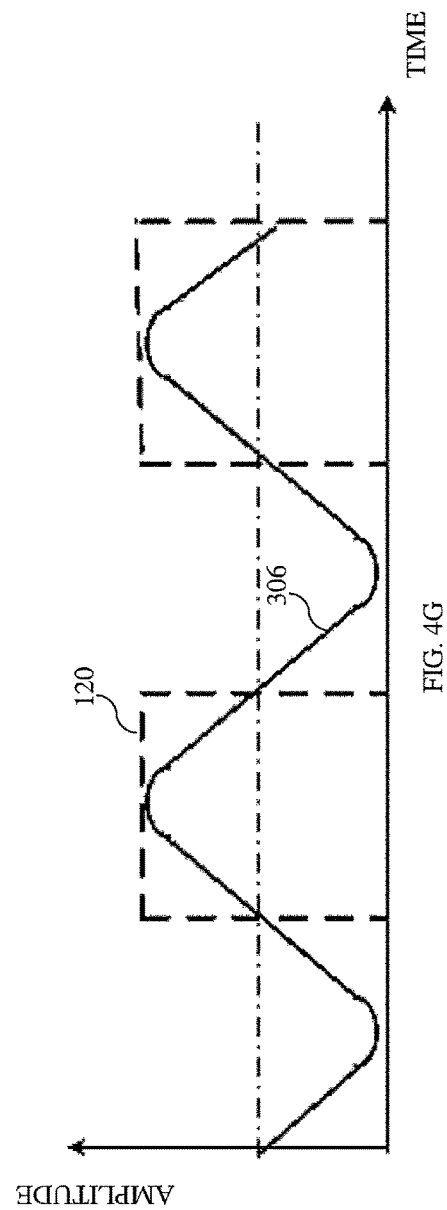
FIG. 4G graphically illustrates time-domain representations of the waveforms of (i) a sampling clock signal input to and (ii) a sampling clock signal output by the receiver clock channel in FIG. 3.

FIG. 4G graphically illustrates time-domain representations of the waveforms of clock signals 120 and 306. As shown, the slew rate of sampling clock signal 306 is less than the slew rate of clock signal 120. This is due, at least in part, to the elimination of high-order harmonics of the clock signal 120 by LPF 304. High-order harmonics tend to produce increased slew rates. Consequently, eliminating the high-order harmonics of clock signal 120 tends to decrease the slew rate of the sampling clock signal. As described above, decreasing the slew rate of the sampling clock signal tends to increase the impact of the sampling clock jitter on the output noise floor and degrade the SNR of the output of the ADC 112.

To summarize, clock channel 300 creates two contradictory effects: (i) LPF 304 and HPF 302 filter out noise, which tends to reduce wideband jitter of the sampling clock signal, and (ii) LPF 304 decreases the slew rate of the sampling clock signal, which tends to increase the impact of sampling clock jitter on the SNR of the output of ADC 112. In many practical cases, the decreased slew rate dominates in this conflict, thereby reducing the SNR of the output of ADC 112 and degrading the noise factor and sensitivity of the receiver.

In order to mitigate this contradictory effect, clock channels of the disclosure (i) pass the fundamental frequency and at least one harmonic frequency (herein referred to as a higher-order harmonic) other than the fundamental frequency of the sampling clock signal and (ii) attenuate the noise in at least the one Nyquist zone that is adjacent to the fundamental frequency $F_s$ (e.g., NZ-2, NZ-3). For ease of discussion, the clock channels of the disclosure, which may be used to implement receiver clock channel 122 of FIG. 1 or a clock channel in another suitable digital radio or another application, are described as receiving the same clock signal 120 from clock generator 118 of FIG. 1. Further, the output of each different clock channel embodiment of the disclosure is identified by a different reference label to indicate that the outputs of the different clock channel embodiments might not be the same.

Figure 5:
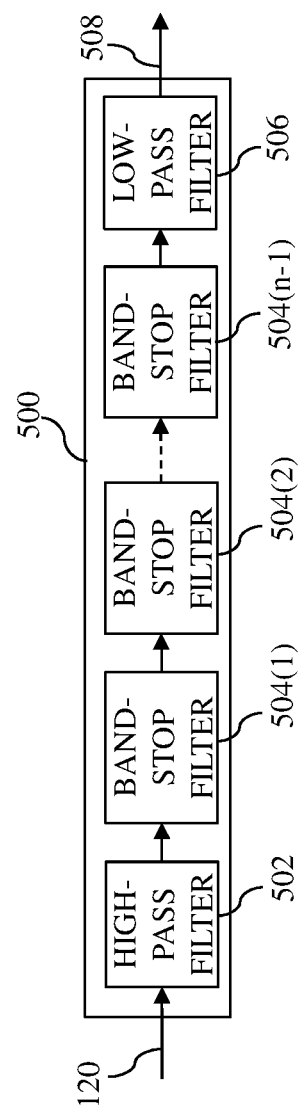
FIG. 5 shows a simplified block diagram of a serial implementation of a clock channel according to one embodiment of the disclosure.
Figure 7F:
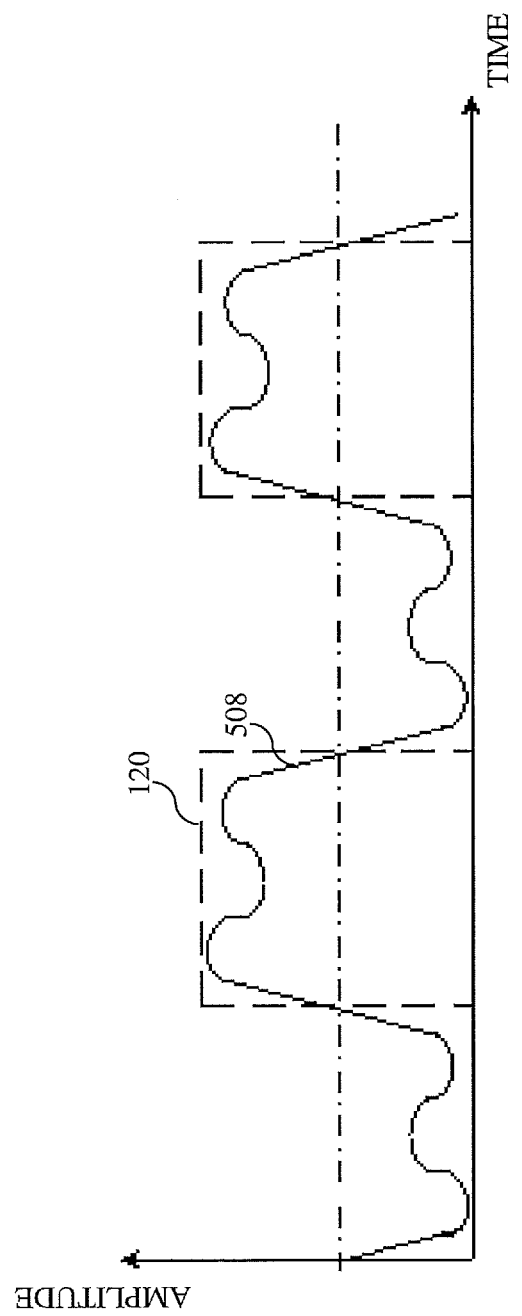
FIG. 7F graphically illustrates time-domain representations of the waveforms of (i) a sampling clock signal input to and (ii) a sampling clock signal output by the receiver clock channel characterized in FIGS. 7A-7E.

FIG. 5 shows a simplified exemplary block diagram of a serial implementation of a receiver clock channel 500 according to one embodiment of the disclosure. In general, receiver clock channel 500 comprises HPF 502 that operates in a manner similar to that of HPF 302. As will be understood by one of ordinary skill in the art, receiver clock channel 500 and the other clock channels of this disclosure may comprise transmission lines (not shown), connecting the components of the receiver clock channel to one another and to the clock generator (e.g., 118) and ADC (e.g., 112). Receiver clock channel 500 also comprises n−1 band-stop filters (BSFs) 504(1), . . . , 504(n−1) and LPF 506, which has an increased band relative to LPF 304 of FIG. 1. Together, HPF 502, BSFs 504(1), . . . , 504(n−1), and LPF 506 (i) pass n>1 odd-numbered harmonic frequencies of clock signal 120, including the fundamental frequency $F_s$, and (ii) attenuate all even-numbered harmonic frequencies and wideband noise in all Nyquist zones within a specified frequency band. To further understand the operation of receiver clock channel 500, consider FIGS. 6A-6H.

FIGS. 6A-6F graphically illustrate frequency domain representations of the amplitude responses of HPF 502, BSF 504(1), BSF 504(2), BSF 504(3), LPF 506, and receiver clock channel 500, respectively, for an implementation having three band-stop filters 504. FIG. 6G graphically illustrates a frequency-domain representation of sampling clock signal 508. Note that the frequency-domain representation of clock signal 120 is omitted but would look similar to that shown in FIG. 4A.

As shown in FIG. 6A, HPF 502 operates in a manner similar to HPF 302 of FIG. 1 to (i) attenuate the noise in Nyquist zones NZ-1 and NZ-2 and (ii) pass all signals greater than or equal to the fundamental frequency $F_s$, including the higher-order harmonics (e.g., $2F_s$, $3F_s$, . . . ) and the noise in the higher-order Nyquist zones (e.g., NZ-3, NZ-4, . . . ) of clock signal 120 with little to no attenuation. As shown in FIGS. 6B through 6D, BSFs 504(1)-504(3) each attenuate a different even-numbered higher-order harmonic frequency and the noise in a corresponding band of four Nyquist zones around that even-numbered harmonic frequency. In particular, BSF 504(1) attenuates the second harmonic frequency $2F_s$ and the noise in Nyquist zones NZ-3 through NZ-6, BSF 504(2) attenuates the fourth harmonic frequency $4F_s$ and the noise in Nyquist zones NZ-7 through NZ-10, and BSF 504(3) attenuates the sixth harmonic frequency $6F_s$ and the noise in Nyquist zones NZ-11 through NZ-14. As shown in FIG. 6E, LPF 506 attenuates all harmonic frequencies and the noise in the Nyquist zones above harmonic frequency $7F_s$.

Thus, together, HPF 502, BSFs 504(1), . . . , 504(3), and LPF 506 (i) pass n=4 odd-numbered harmonic frequencies, including the fundamental frequency $F_s$ and the first n−1=3 odd-numbered higher-order harmonic frequencies of clock signal 120, with little attenuation and (ii) attenuate most other noise, including noise from electrically or magnetically coupled signals 106, 110, 114, 126, 128, 130, 134, 136, 140, 144, 148, and digital signals in digital section 116 as shown in FIG. 6F. As a result, sampling clock signal 508 has amplitudes at fundamental frequency $F_s$ and harmonic frequencies $3F_s$, $5F_s$, and $7F_s$ that are not attenuated, and amplitudes at harmonic frequencies $2F_s$, $4F_s$, and $6F_s$ that are attenuated.

Similar to receiver clock channel 300 of FIG. 3, receiver clock channel 500 reduces the phase-noise spectral density in much of the integration bandwidth of clock signal 120, thereby reducing sampling clock jitter. However, unlike receiver clock channel 300 of FIG. 3, receiver clock channel 500 does not attenuate the first n−1 higher-order odd-numbered harmonics of clock signal 120. As a result, sampling clock signal 508 has a higher slew rate than sampling clock signal 306 in FIG. 3. Further, since some of the higher-order odd-numbered harmonics of clock signal 120 are passed by receiver clock channel 500, sampling clock signal 508 has a greater amount of phase noise within the wideband bandwidth (i.e., the area under the curve between frequency offsets $f_1$ and $f_3$ of FIG. 4F is smaller for sampling clock signal 306 than the area under an equivalent curve due to the aliasing effects in the ADC 112 that may be generated for sampling clock signal 508).

FIG. 6H graphically illustrates time-domain representations of the waveforms of clock signals 120 and 508. As shown, the slew rate of sampling clock signal 508 more closely matches the slew rate of clock signal 120 than does sampling clock signal 306 of FIG. 3 (shown in FIG. 4G). The higher slew rate of sampling clock signal 508 increases the SNR of the output of ADC 112, thereby improving the noise figure and sensitivity of the receiver and the overall performance of the receiver of the digital radio.

As described above, the number of BSFs 504 may be greater than or equal to one. As the number of BSFs 504 are increased or decreased, the number of odd-numbered harmonics that are passed increases or decreases at a rate of one odd-numbered harmonic per additional BSF 504. Decreasing the number of BSFs 504 decreases the implementation complexity of the receiver clock channel. As the number of BSFs 504, and consequently the number of odd-numbered harmonics passed, decreases, the slew rate of sampling clock signal 508 decreases. However, harmonic frequencies further away from the fundamental frequency $F_s$ have a smaller effect on the slew rate. In other words, each additional BSF 504 has less of an effect on the slew rate than the previous BSF 504. Therefore, BSFs 504 that pass harmonic frequencies further away from the fundamental frequency $F_s$ may be removed without having a significant adverse impact on the slew rate of sampling clock signal 508. Compared to receiver clock channel 300 of FIG. 3, receiver clock channel 500 has a higher slew rate, reducing impact of the clock noise and jitter on the output of ADC 112. As a result, the sampling clock signal generated by receiver clock channel 500 increases the SNR of the output of ADC 112, thereby improving the noise figure and sensitivity of the receiver and the overall performance of the digital radio, when compared to sampling clock signals generated by receiver clock channel 300. The significance of this effect increases as the amplitude of the clock signal decreases.

Although clock channel 500 was described as employing BSFs 504 having stop-band widths of close to four Nyquist zones, embodiments of the disclosure are not so limited. According to alternative embodiments, clock channels of the disclosure may be implemented using BSFs 504 having bandwidths greater than or less than four Nyquist zones. Typically, the complexity of a BSF increases as the number of Nyquist zones that are attenuated increases and decreases as the number of Nyquist zones that are attenuated decreases. For instance, suppose that clock channel 500 in FIG. 5 is implemented having one BSF 504, where the BSF 504 has a bandwidth of one Nyquist zone. This embodiment is illustrated in FIGS. 7A-7F.

FIGS. 7A-7D graphically illustrate frequency-domain representations of the amplitude responses of HPF 502, the one BSF 504, LPF 506, and receiver clock channel 500, respectively. FIG. 7E graphically illustrates a frequency-domain representation of sampling clock signal 508, and FIG. 7F graphically illustrates time-domain representations of the waveforms of clock signals 120 and 508. Note that the frequency-domain representation of clock signal 120 is omitted but would look similar to that shown in FIG. 4A.

As shown in FIG. 7A, HPF 502 operates in a manner similar to that described above in relation to FIG. 6A. As shown in FIG. 7B, BSF 504 attenuates most of the noise in Nyquist zone NZ-3 and part of the noise in Nyquist zone NZ-4, and, as shown in FIG. 7C, LPF 506 attenuates the noise in all harmonic frequencies and Nyquist zones above the third harmonic frequency $3F_s$. Thus, together, HPF 502, BSF 504, and LPF 506 (i) pass the fundamental frequency $F_s$, the second harmonic frequency $2F_s$, the third harmonic frequency $3F_s$, part of the noise Nyquist zone NZ-4, and all of the noise in Nyquist zones NZ-5 and NZ-6, and (ii) attenuate noise in Nyquist zones NZ-1, NZ-2, NZ-3, and Nyquist zones NZ-7 and higher, and all harmonic frequencies higher than third harmonic frequency $3F_s$ as shown in FIG. 7D.

Generally, decreasing the bandwidth of each BSF 504 reduces the amount of noise that is attenuated in the sampling clock signal, thereby increasing the corresponding jitter within the wideband bandwidth. Thus, the sampling clock signal generated by the clock channel characterized in FIGS. 7A-7E suffers from a higher amount of noise than the sampling clock signal generated by a comparable clock channel that implements one BSF 504 having a bandwidth of four Nyquist zones. However, since the clock channel characterized in FIGS. 7A-7E passes at least one higher-order harmonic, the clock signal generated by the clock channel may have a higher slew rate than the clock signal generated by clock channel 300 of FIG. 3.

Although clock channel 500 was described as employing HPF 502, which (i) attenuates the noise in both Nyquist zones NZ-1 and NZ-2, embodiments of the disclosure are not so limited. According to alternative embodiments, a BSF may be implemented in lieu of HPF 502, where the BSF attenuates noise in Nyquist zone NZ-2 but not in Nyquist zone NZ-1. This reduces the size and cost of the clock channel without having a significant impact on the SNR of the output of ADC 112.

Further, although clock channel 500 was described as employing LPF 506, embodiments of the disclosure are not so limited. According to alternative embodiments, clock channels of the disclosure can be implemented without LPF 506.

Yet further, according to alternative embodiments, linear elements 502-506 of FIG. 5 may be arranged in order that is different from those shown in FIG. 5.

Even yet further, HPF 502 and LPF 506 of FIG. 5 may be substituted with a single band-pass filter.

Figure 8:
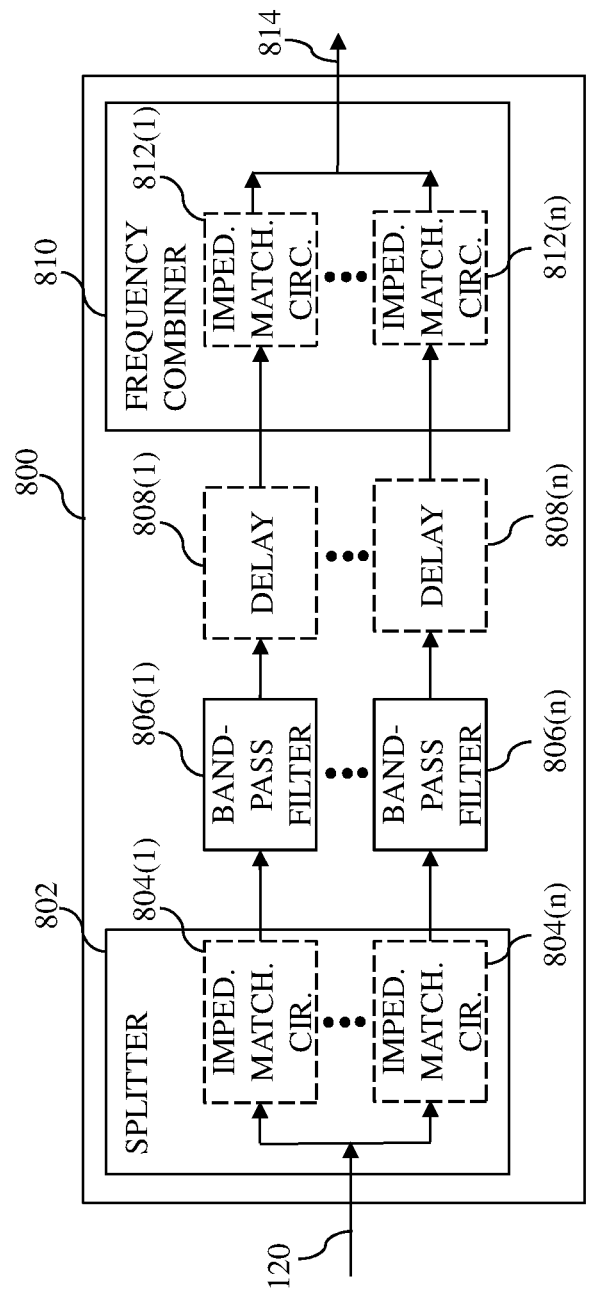
FIG. 8 shows a simplified block diagram of a parallel implementation of a receiver clock channel according to one embodiment of the disclosure.

FIG. 8 shows a simplified exemplary block diagram of a parallel implementation of a receiver clock channel 800 according to one embodiment of the disclosure. Receiver clock channel 800 may comprise splitter 802 that splits clock signal 120 into n>1 parallel paths in a lossless manner such that the power of the fundamental frequency is provided to the first path, the power of the high-order harmonic, for example, the third harmonic is provided to the second path, and so on. Each of the n parallel paths comprises a different BPF 806 that is centered on a different high-order harmonic, for example on an odd-numbered harmonic frequency. BPF 806(1) passes the fundamental frequency $F_s$ and attenuates noise and all other signals, BPF 806(2) passes the high-order harmonic, for example, the third harmonic $3F_s$ and attenuates noise and all other signals, and BPF 806(n) passes the n$^{th}$ odd-numbered harmonic. The filtered signals on the n paths are then combined by frequency combiner 810 to generate sampling clock signal 814.

Each parallel path may optionally comprise (i) an impedance matching circuit 804 to match the impedance of clock signal 120 with the input of the corresponding BPF 806 (ii) a delay element 808 to compensate for a difference in a delay between the path and the other paths (if any exists), and (iii) an impedance matching circuit 812 to match the impedance of the output of the corresponding BPF 806 with the impedance of the input to the ADC (e.g., 112) as indicated by the dashed lines around those components. Further, receiver clock channel 800 also comprises transmission lines (not shown) that connect the components of each path to one another and connect receiver clock channel 800 to the clock generator (e.g., 118) and the ADC (e.g., 112). To further understand the operation of receiver clock channel 800, consider FIGS. 9A-9F.

FIGS. 9A-9E graphically illustrate frequency domain representations of the amplitude responses of BPFs 806(1)-806(4) and receiver clock channel 800 for an implementation having four BPFs 806. FIG. 9F graphically illustrates a frequency-domain representation of sampling clock signal 814, and FIG. 9G graphically illustrates time-domain representations of the waveforms of clock signals 120 and 814. Note that the frequency-domain representation of clock signal 120 is omitted but would look similar to that shown in FIG. 4A.

As shown in FIGS. 9A-9D, BPF 806(1) passes the fundamental frequency $F_s$ and attenuates noise and all other signals, BPF 806(2) passes the third harmonic frequency $3F_s$ and attenuates noise and all other signals, BPF 806(3) passes the fifth harmonic frequency $5F_s$ and attenuates noise and all other signals, and BPF 806(4) passes the seventh harmonic frequency $7F_s$ and attenuates noise and all other signals. Thus, receiver clock channel 800 (i) passes the fundamental frequency $F_s$ and the first three higher-order odd-numbered harmonic frequencies of clock signal 120 with little attenuation and (ii) attenuates most other noise, including noise from electrically or magnetically coupled signals 106, 110, 114, 126, 128, 130, 134, 136, 140, 144, 148, and digital signals in digital section 116 as shown in FIG. 9E.

Figure 9G:
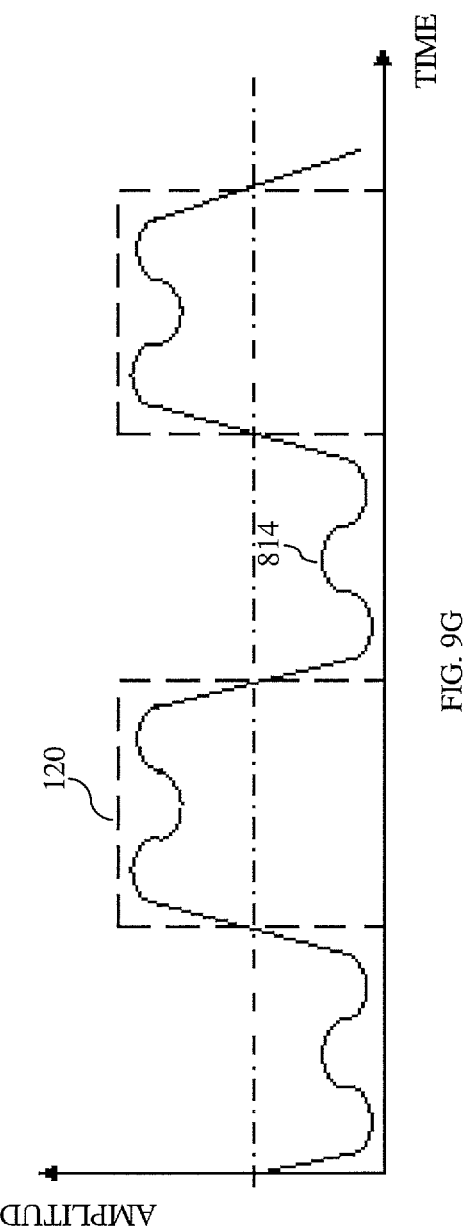
FIG. 9G graphically illustrates time-domain representations of the waveforms of (i) a clock signal input to and (ii) a sampling clock signal output by the receiver clock channel in FIG. 8.

As a result, sampling clock signal 814 has amplitudes at fundamental frequency $F_s$ and harmonic frequencies $3F_s$, $5F_s$, and $7F_s$ that are not attenuated, and amplitudes at harmonic frequencies $2F_s$, $4F_s$, and $6F_s$ that are attenuated as shown in FIG. 9F. Further, as shown in FIG. 9G, the slew rate of sampling clock signal 814 more closely matches the slew rate of clock signal 120 than does sampling clock signal 306 of FIG. 3 (shown in FIG. 4G). The higher slew rate of sampling clock signal 814 increases the SNR of the output of ADC 112, thereby improving the noise figure and sensitivity of the receiver and the overall performance of the receiver of the digital radio.

As described above, the number n of parallel paths, and consequently, the number of BPFs 806, is greater than one. According to some embodiments, the number of BPFs 806 may be equal to two, such that only the fundamental frequency $F_s$ and the third harmonic frequency $3F_s$ are passed. As the number of parallel paths is increased or decreased, the number of odd-numbered harmonics that are passed increases or decreases at a rate of one odd-numbered harmonic per additional BPF 806. Decreasing the number of BPFs 806 decreases the implementation complexity of the receiver clock channel. As the number of BPFs 806, and consequently the number of odd-numbered harmonics passed, decreases, the slew rate of sampling clock signal 814 decreases. However, each additional BPF 806 has less of an effect on the slew rate than the previous BPF 806. Therefore, BPFs 806 that pass harmonic frequencies further away from the fundamental frequency $F_s$ may be removed without having a significant adverse impact on the slew rate of sampling clock signal 814.

Figure 10:
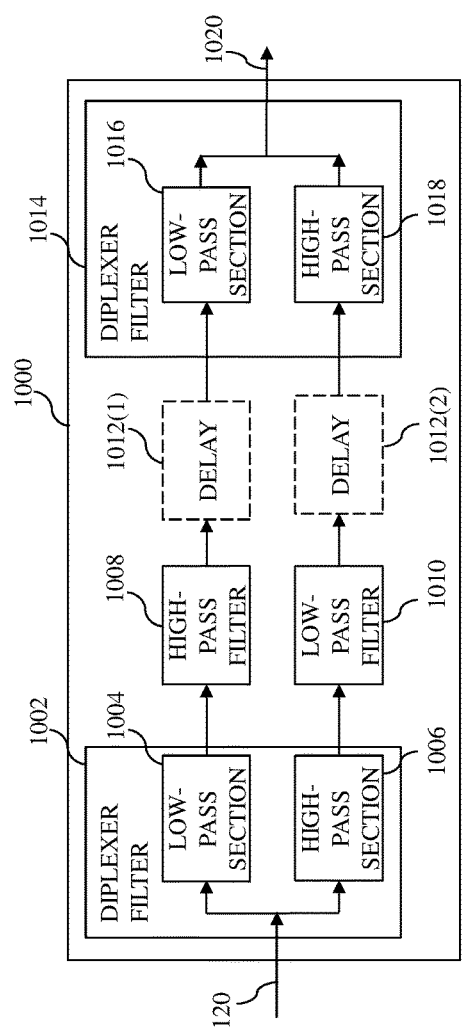
FIG. 10 shows a simplified block diagram of a parallel implementation of a receiver clock channel according to another embodiment of the disclosure.
Figure 11:
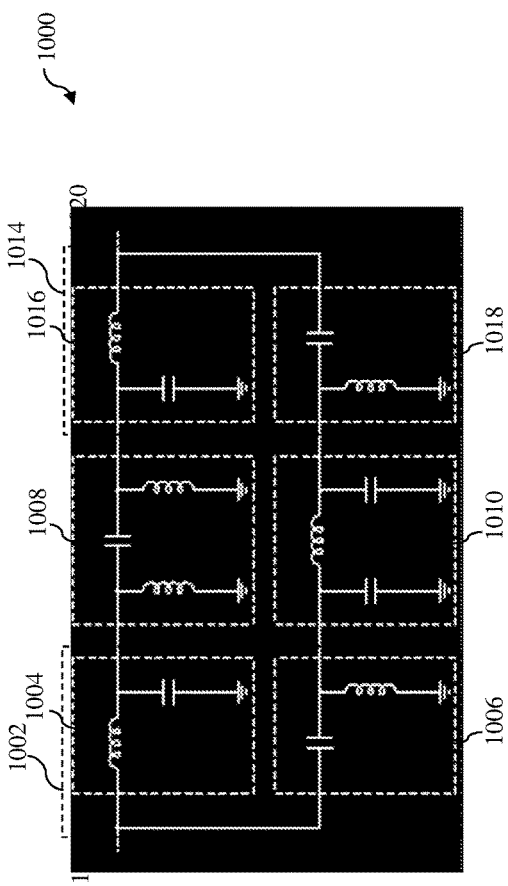
FIG. 11 shows a simplified schematic diagram of one implementation of the receiver clock channel in FIG. 10.

FIG. 10 shows a simplified exemplary block diagram of a parallel implementation of a receiver clock channel 1000 according to another embodiment of the disclosure, and FIG. 11 shows a simplified exemplary schematic diagram of one implementation of receiver clock channel 1000. Receiver clock channel 1000 has (i) an upper path that comprises low-pass sections 1004 and 1016 of diplexer filters 1002 and 1014, respectively, HPF 1008 and an optional delay element 1012(1), and (ii) a lower path that comprises high-pass sections 1006 and 1018 of diplexer filters 1002 and 1014, respectively, LPF 1010, and an optional delay element 1012(2). The upper path may pass the fundamental frequency $F_s$ and attenuates noise and all other signals, and the lower path may pass the third harmonic $3F_s$ and attenuates noise and all other signals as illustrated in FIGS. 12A-12D.

Figure 12:
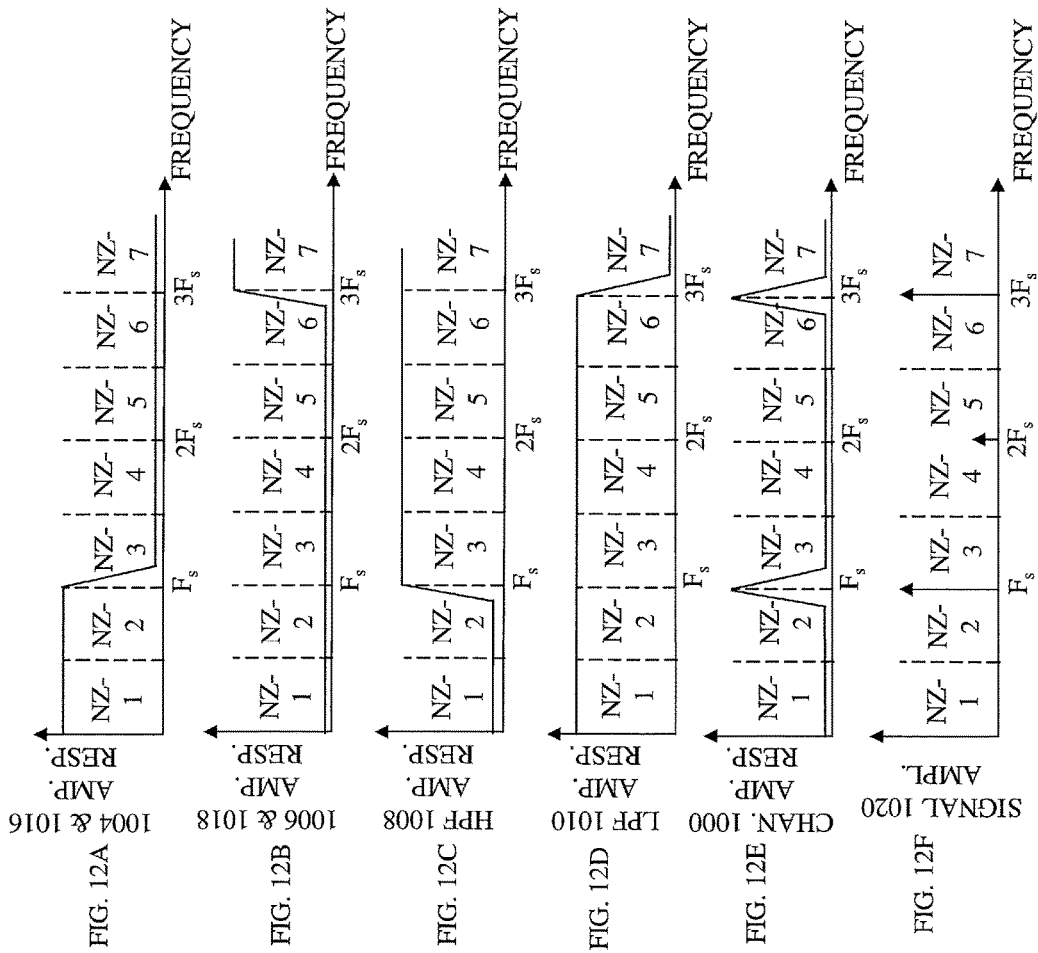
FIGS. 12A-12E graphically illustrate frequency domain representations of the amplitude responses of the low-pass sections, high-pass sections, high-pass filter, low-pass filter, and receiver clock channel of FIG. 10.
FIG. 12F graphically illustrates a frequency-domain representation of the sampling clock signal output by the receiver clock channel in FIG. 10.

FIGS. 12A-12E graphically illustrate frequency domain representations of the amplitude responses of low-pass sections 1004 and 1016, high-pass sections 1006 and 1018, HPF 1008, LPF 1010, and receiver clock channel 1000. FIG. 12F graphically illustrates a frequency-domain representation of sampling clock signal 1020. On the upper path, low-pass sections 1004 and 1016 each pass all signals less than or equal to the fundamental frequency $F_s$ and attenuate noise above the fundamental frequency $F_s$ as shown in FIG. 12A, and high-pass filter 1008 attenuates noise below the fundamental frequency F and passes all signals greater than or equal to the fundamental frequency $F_s$ as shown in FIG. 12C. On the lower path, high-pass sections 1006 and 1018 each attenuate all signals below the third harmonic $3F_s$ and pass all signals greater than or equal to the third harmonic $3F_s$ as shown in FIG. 12B, and low-pass filter 1010 passes all signals less than or equal to the third harmonic $3F_s$ and attenuates noise above the third harmonic $3F_s$ as shown in FIG. 12D.

Thus, receiver clock channel 1000 passes the fundamental frequency $F_s$ and harmonic frequency $3F_s$ and attenuates all other noise as shown in FIG. 12E such that sampling clock signal 1020 has amplitudes at fundamental frequency $F_s$ and harmonic frequency $3F_s$ that are not attenuated, and amplitudes at all other frequencies that are attenuated as shown in FIG. 12F.

Figure 13:
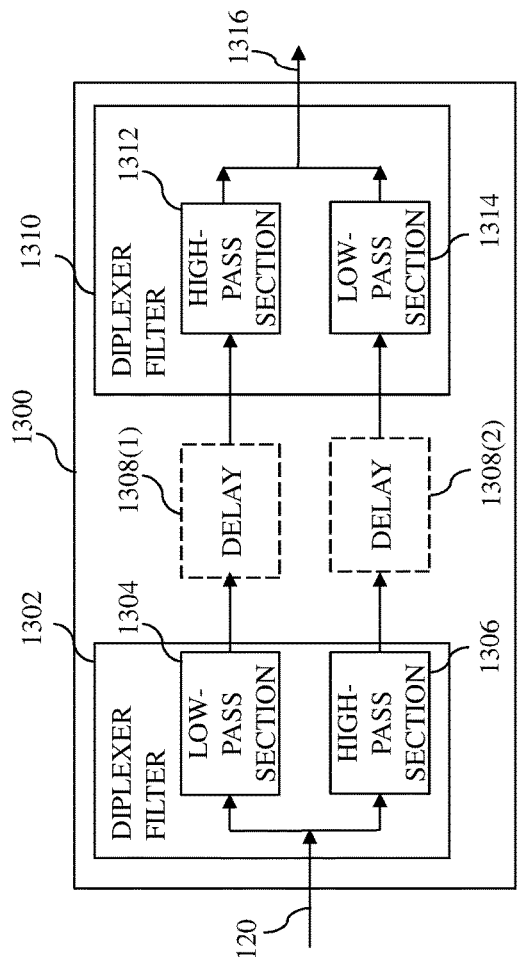
FIG. 13 shows a simplified block diagram of a parallel implementation of a receiver clock channel according to yet another embodiment of the disclosure.

FIG. 13 shows a simplified exemplary block diagram of a parallel implementation of a receiver clock channel 1300 according to yet another embodiment of the disclosure. Receiver clock channel 1300 operates in a manner similar to that of receiver clock channel 1000. However, the upper path of receiver clock channel 1300 passes the fundamental frequency using low-pass section 1304 of diplexer filter 1302 and high-pass section 1312 of diplexer filter 1310, which together operate as a low-loss BPF and eliminate the need for HPF 1008. Further, the lower path of receiver clock channel 1300 passes the third harmonic $3F_s$ using high-pass section 1306 of diplexer filter 1302 and low-pass section 1314 of diplexer filter 1310, which together operate as a low-loss BPF and eliminate the need for LPF 1010. Each path may also comprise an optional delay element 1308.

The amplitude responses of low-pass section 1304, high-pass section 1306, high-pass section 1312, low-pass section 1314, and receiver clock channel 1300 look similar to the amplitude responses shown in FIGS. 12A-12E, respectively. Further, the amplitudes of signal 1316 look similar to those shown in FIG. 12F.

Figure 14:
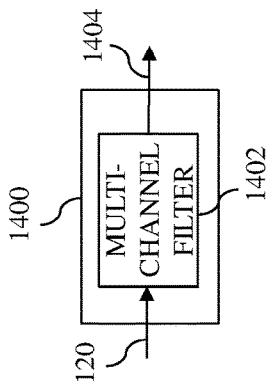
FIG. 14 shows a simplified block diagram of a parallel implementation of a receiver clock channel according to even yet another embodiment of the disclosure.

FIG. 14 shows a simplified exemplary block diagram of a parallel implementation of a receiver clock channel 1400 according to even yet another embodiment of the disclosure. Receiver clock channel 1400 comprises multi-channel filter 1402, which is implemented as a single filter with a multi-band characteristic to (i) pass n harmonic frequencies, including the fundamental frequency $F_s$ and a specified number of odd-numbered higher-order harmonics, and (ii) attenuate all other signals and noise. For a two-channel filter, the amplitude response of receiver clock channel 1400 would look similar to the amplitude response of receiver clock channel 1000 shown in FIG. 12E, and the frequency-domain representation of sampling clock signal 1404 would look similar to the frequency-domain representation of sampling clock signal 1020 in FIG. 12F.

Although clock channels of the disclosure have been described as passing odd-numbered harmonics, clock channels of the disclosure are not so limited. According to alternative embodiments, clock channels of the disclosure may pass even-numbered harmonics in addition to, or in lieu of, odd-numbered harmonics. Some of these embodiments may be implemented using non-square wave clock signals, such as clock signals having a saw-tooth waveform.

Although clock channels have been described relative to their use with receivers in digital radios, clock channels of the disclosure are not so limited. According to alternative embodiments, clock channels of the disclosure may be implemented in transmitters of digital radios such as in transmitter clock channel 132 and in applications other than digital radios that employ clock signals, such as RF synthesizers, FPGA, etc.

Although clock channels of the disclosure have been described relative to their use with ADC 112, clock channels of the disclosure are not so limited. Clock channels of the disclosure may be used, for example, with DAC 142 or in any reference clock circuit where band-limiting (noise filtering) and fast slew rate are desired. For example, clock channels of the disclosure may be used in RF synthesizer reference input circuits.

According to alternative embodiments, clock channels of the disclosure may be implemented with absorption elements such as resistors or attenuators. For example, receiver clock channel 500 may be implemented with absorption elements positioned at one or both ends of receiver clock channel 500 and/or between the filters of receiver clock channel 500. Such absorption elements may improve impedance matching, reduce reflections, and improve transmission characteristics of receiver clock channel 500, thereby further increasing the SNR of the output of ADC 112.

According to further embodiments, clock channels of the disclosure may be implemented using RF transformers in lieu of low-pass filters such as LPF 506 or BPFs 502 and 506, where the RF transformers have similar frequency response characteristics to LPF 506 or BPFs formed from HPF 502 and LPF 506.

Clock channels of the disclosure may implement high-pass filters, low-pass filters, and/or band-stop filters having a single-ended or differential structure. Further, these filters may be implemented as linear filters using, for example LC filters, ceramic filters, multilayered filters, SAW filters, BAW filters, or other suitable filters. Filter selection may depend on the requirements of the overall application and the characteristics of each filter (e.g., insertion loss, stop-band attenuation, sharpness of the roll-off characteristic, impedance, group delay, return loss, power handling, etc.).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

For instance, various filters described herein may be implemented using any suitable type of filter, including, but not limited to, discrete LC filters, crystal filters, ceramic filters, surface acoustic wave (SAW) filters, bulk acoustic wave (BAW) filters, low-temperature co-fired ceramic (LTCC) filters, ceramic lamination technique filters, microstrip filters, and stripline filters. The particular types and specifications of the filters used may depend on the clock frequency and other design specifics such as the insertion loss, stop-band attenuation, sharpness of the roll-off characteristic, impedance, group delay, return loss, power handling, etc.

Further, splitters and frequency combiners described herein may be implemented as, for example a hybrid n-way, an N-plexer, a T-junction, a lumped element, or any other suitable device. Yet further, delay elements described herein may be implemented as, for example, a transmission line, an electric network approximation of a transmission line, a filter, a buffer, or any other suitable delay device. Even yet still further, impedance matching circuits described herein may be implemented as, for example, an LC network, transmission line impedance transformer, or any other suitable impedance matching device.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising:
   a clock generator configured to generate an initial clock signal having a fundamental frequency; and a clock channel configured to generate a filtered clock signal from the initial clock signal, wherein the clock channel comprises at least one filter configured to (i) attenuate noise in at least one Nyquist zone of the initial clock signal adjacent to the fundamental frequency and (ii) pass at least one harmonic frequency of the initial clock signal other than the fundamental frequency to generate the filtered clock signal.

2. The apparatus of claim 1, wherein each harmonic frequency passed by the clock channel is an odd-numbered harmonic frequency.

3. The apparatus of claim 1, wherein the at least one harmonic frequency is a third harmonic frequency that is four Nyquist zones away from the fundamental frequency.

4. The apparatus of claim 1, wherein the clock channel comprises at least one band-stop filter configured to attenuate the noise in the at least one Nyquist zone of the initial clock signal, wherein the at least one Nyquist zone is above the fundamental frequency.

5. The apparatus of claim 4, wherein the at least one band-stop filter is configured to attenuate (i) noise in two adjacent pairs of adjacent Nyquist zones and (ii) one harmonic frequency between the two adjacent pairs of adjacent Nyquist zones.

6. The apparatus of claim 4, wherein the clock channel further comprises:
a high-pass filter configured to attenuate noise in a first set of one or more other Nyquist zones of the initial clock signal below the fundamental frequency; and
a low-pass filter configured to attenuate noise in a second set of one or more other Nyquist zones of the initial clock signal above the at least one Nyquist zone.

7. The apparatus of claim 6, wherein the at least one band-stop filter and the high-pass filter are configured to, in combination, pass the fundamental frequency and the at least one harmonic frequency, while attenuating noise (i) in one or more Nyquist zones on either side of the fundamental frequency and (ii) in one or more Nyquist zones on either side of the harmonic frequency.

8. The apparatus of claim 1, wherein:
the at least one harmonic frequency comprises only two or more odd-numbered harmonic frequencies of the initial clock signal; and
the at least one filter is configured to pass the two or more odd-numbered harmonic frequencies and attenuate all even-numbered harmonic frequencies to generate the filtered clock signal.

9. The apparatus of claim 1, wherein the apparatus is a digital radio.

10. The apparatus of claim 1, further comprising an analog-to-digital converter and wherein the reference clock signal is a sampling clock signal.

11. The apparatus of claim 1, wherein:
the clock channel is configured to split the initial clock signal into n>1 parallel paths;
a first of the parallel paths is configured to pass the fundamental frequency; and a second of the parallel paths is configured to pass a harmonic frequency, other than the fundamental frequency.

12. The apparatus of claim 11, wherein:
the first of the parallel paths comprises a band-pass filter configured to pass the fundamental frequency and attenuate noise on either side of the fundamental frequency; and
the second of the parallel paths is configured to pass the harmonic frequency and attenuate noise on either side of the harmonic frequency.

13. A method for processing an input signal comprising:
(a) generating an initial clock signal having a fundamental frequency; and
(b) generating a filtered clock signal from the initial clock signal by (i) attenuating noise in at least one Nyquist zone of the initial clock signal adjacent to the fundamental frequency and (ii) passing at least one harmonic frequency of the initial clock signal other than the fundamental frequency to generate the filtered clock signal.

14. The method of claim 13, wherein each harmonic frequency passed in step (b) is an odd-numbered harmonic frequency.

15. The method of claim 13, wherein the at least one harmonic frequency is a third harmonic frequency that is four Nyquist zones away from the fundamental frequency.

16. The method of claim 13, wherein step (b) comprises (b1) attenuating the noise in the at least one Nyquist zone of the initial clock signal, wherein the at least one Nyquist zone is above the fundamental frequency.

17. The method of claim 16, wherein step (b1) comprises attenuating (i) noise in two adjacent pairs of adjacent Nyquist zones and (ii) one harmonic frequency between the two adjacent pairs of adjacent Nyquist zones.

18. The method of claim 16, wherein step (b) further comprises:
(b2) attenuating noise in a first set of one or more other Nyquist zones of the initial clock signal below the fundamental frequency; and
(b3) attenuating noise in a second set of one or more other Nyquist zones of the initial clock signal above the at least one Nyquist zone.

19. The method of claim 18, wherein:
steps (b1) and (b2) together pass the fundamental frequency and the at least one harmonic frequency, while attenuating noise (i) in one or more Nyquist zones on either side of the fundamental frequency and (ii) in one or more Nyquist zones on either side of the harmonic frequency.

20. The method of claim 13, wherein:
the at least one harmonic frequency comprises only two or more odd-numbered harmonic frequencies of the initial clock signal; and
step (b) comprises passing the two or more odd-numbered harmonic frequencies while attenuating all even-numbered harmonic frequencies to generate the filtered clock signal.

* * * * *